(12) United States Patent
Nobusawa

(10) Patent No.: US 6,205,217 B1
(45) Date of Patent: Mar. 20, 2001

(54) PORTABLE TELEPHONE SET

(75) Inventor: Hideaki Nobusawa, Saitama (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/087,212

(22) Filed: May 29, 1998

(30) Foreign Application Priority Data

May 30, 1997 (JP) .................................................. 9-141396

(51) Int. Cl.[7] .................................................. H04M 11/00
(52) U.S. Cl. .......................... 379/395; 379/387; 455/570
(58) Field of Search .................................... 379/387, 390, 379/395; 455/570

(56) References Cited

U.S. PATENT DOCUMENTS

| 4,847,897 | 7/1989 | Means . |
| 5,379,338 | 1/1995 | Umemoto et al. . |

FOREIGN PATENT DOCUMENTS

| 0 682 437 A2 | 11/1995 | (EP) . |
| 1406663 | 9/1975 | (GB) . |
| 63-299434 | 12/1988 | (JP) . |
| 5-103070 | 4/1993 | (JP) . |
| 6-6441 | 1/1994 | (JP) . |
| 406006441 | * 1/1994 | (JP) ................................ H04M/1/60 |
| 408032484 | * 1/1994 | (JP) ................................ H04B/1/62 |
| 3034658 | 12/1996 | (JP) . |
| 409046154 | * 2/1997 | (JP) ................................ H04M/1/00 |

* cited by examiner

*Primary Examiner*—Stella Woo
(74) *Attorney, Agent, or Firm*—Scully, Scott, Murphy & Presser

(57) ABSTRACT

A portable telephone set includes a demodulating circuit which demodulates a signal from a base station to output a demodulated signal. A first signal processing unit amplifies the demodulated signal to output a first amplified signal. An earphone converts the first amplified signal into a sound. A microphone converts a sound into a signal. A second signal processing unit amplifies the signal from the microphone to output a second amplified signal. A modulating circuit modulates the second amplified signal to output a modulated signal. A volume control unit increases the amplification degrees of the signal processing units in accordance with the user's selection. A band limiting circuit limits to the voice band the sound input through the microphone. An S/N determining circuit compares the level of the signal from the microphone and the level of a signal from the band limiting circuit. The volume control unit is rendered inoperative if the S/N determining circuit judges that the ratio of the level of the signal from the microphone to the level of the signal from the band limiting circuit has exceeded a predetermined range during the operation of the volume control unit.

6 Claims, 3 Drawing Sheets

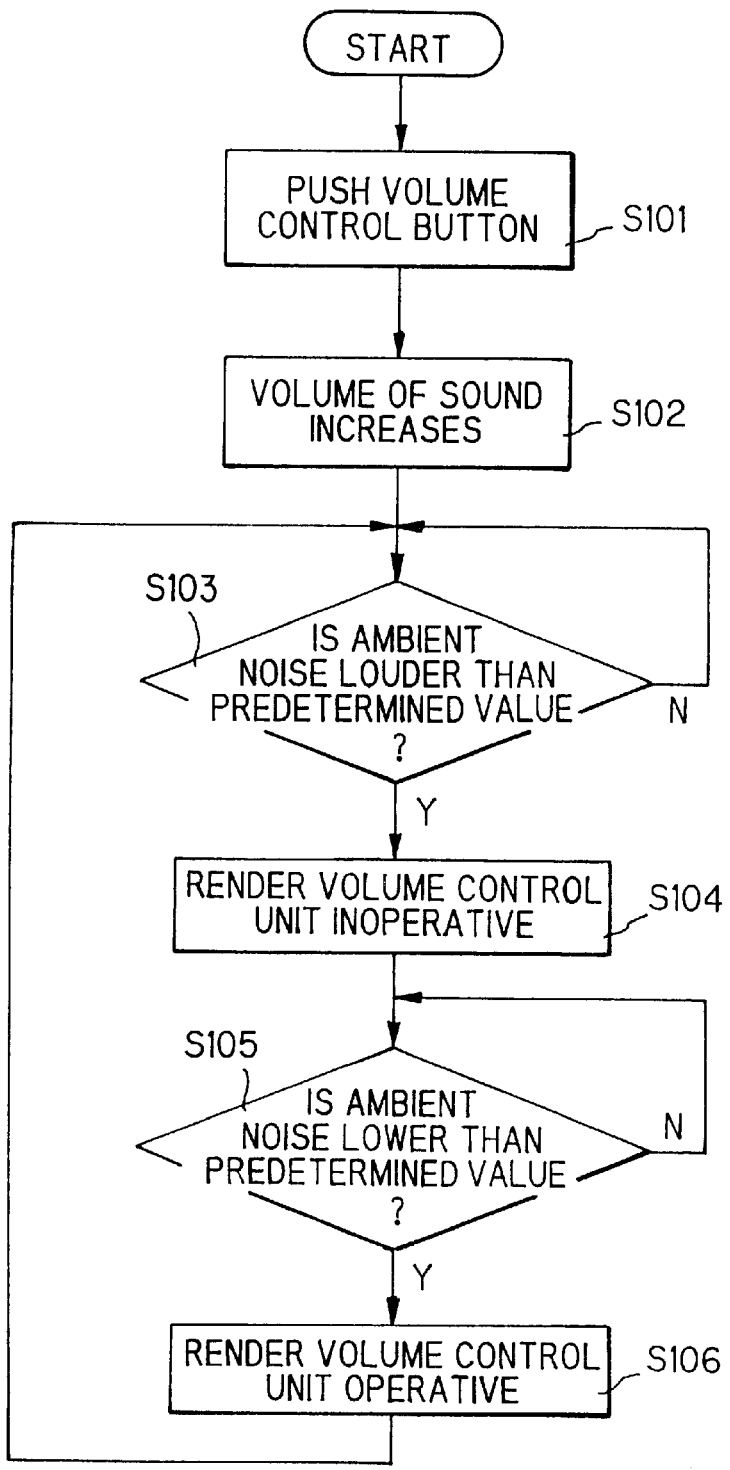

PORTABLE TELEPHONE SET

FIELD OF THE INVENTION

This invention relates to a portable telephone set, and more particularly to a portable telephone set which has the function of magnifying the sound collected by its microphone and the sound output from its earphone.

BACKGROUND OF THE INVENTION

It is possible to arbitrarily set the amplification degree for the sound signals from the microphone of a conventional portable telephone set before the portable telephone set is delivered as a final product. Once this amplification degree is preset, however, the telephone set can be used only at the preset degree. The telephone set may move with the user to various places, and be used in various environments. Because the amplification degree is preset, however, the telephone set is not easily adaptable to various aural environments. If the preset amplification degree is relatively low, the user may speak louder naturally in a noisy environment, bothering or annoying other people.

In connection with such a problem, Japanese Patent Laid-Open No. H.6-6441 discloses a portable telephone set with which the user can speak lower in a public environment in order not to annoy the public. The portable telephone set is provided with a manual switch for setting a public environment mode, when the user uses it in a public environment. When the public environment is set by turning the manual switch on, transmitting and receiving sound amplifiers are increased in amplification degree, and a sidetone amplifier is turned on to provide the user with an amplified sidetone.

As a result, in the public environment mode, the sidetone is louder when the user is speaking. This naturally makes the user speak or vocalize lower in this mode. In this mode, the amplification degree of the other sound signal amplifier 9 is higher. Therefore, in this mode, the volume of the sound heard by the other party is not affected even if the user speaks low.

In the public environment mode, unconditionally, the amplification degree of the sound signal amplifier 9 connected to the microphone 11 is increased, and sidetone is output to be increased in level from the earphone 5. This prompts the user to speak lower. Therefore, in a very noisy environment, the user speaks low and the amplification degree of the sound signal amplifier 9 is higher, and consequently the other party hears more noise.

In a digital portable telephone set or the like, high-or dense-compression sound coding technique is used. In this case, for simple coding of non-voice, when the noise level is high, the collected sound is coded as a sound signal of small volume. Consequently, if the user speaks low in a noisy place, the other party may hear a deteriorated voice. As a result, the party may ask the user to speak loud, or to cancel the public environment mode.

SUMMARY OF THE INVENTION

Accordingly, it is an object of the invention to provide a portable telephone set with which the user's voice can be heard easily by the other party even if the noise around the user is loud while the set is used with the volume of sound increased.

A portable telephone set according to the invention comprises:

a demodulating circuit for demodulating a signal from a base station to output a demodulated signal;

a first signal processing unit for amplifying the demodulated signal to output a first amplified signal;

an earphone for converting the first amplified signal into a sound;

a microphone for converting a sound into a signal;

a second signal processing unit for amplifying the signal from the microphone to output a second amplified signal;

a modulating circuit for modulating the second amplified signal to output a modulated signal;

a volume control unit for increasing the amplification degrees of the first and second signal processing units to perform a volume increasing process in accordance with the user's selection;

a band limiting circuit for limiting to the voice band the sound input through the microphone; and an S/N determining circuit for comparing the level of the signal from the microphone and the level of a signal from the band limiting circuit.

The volume control unit is rendered inoperative if the S/N determining circuit judges that the ratio of the level of the signal from the microphone to the level of the signal from the band limiting circuit has exceeded a predetermined range during the operation of the volume control unit.

Even while the volume increasing process is performed, the amplification degree of the first signal processing unit decreases automatically if the ambient noise is loud relatively to the user's voice. This inhibits the user from speaking excessively low. At the same time, the amplification degree of the second signal processing unit decreases. This prevents the ambient noise from being heard loudly by the other party.

The volume control unit may be rendered operative if the S/N determining circuit judges that the ratio of the level of the signal from the microphone to the level of the signal from the band limiting circuit has decreased to a predetermined range while the volume control unit is inoperative. In this case, the user does not need to switch the mode for the volume increasing process in each circumstance or environment.

BRIEF DESCRIPTION OF THE DRAWINGS

The invention will be explained in more detail in conjunction with the appended drawings, wherein:

FIG. 3 is a flowchart showing the operation of this telephone set.

DETAILED DESCRIPTION OF THE PREFERRED EMBODIMENT

Before explaining a portable telephone set in a preferred embodiment according to the invention, the aforementioned conventional portable telephone set will be explained in FIG. 1.

Figure 1:
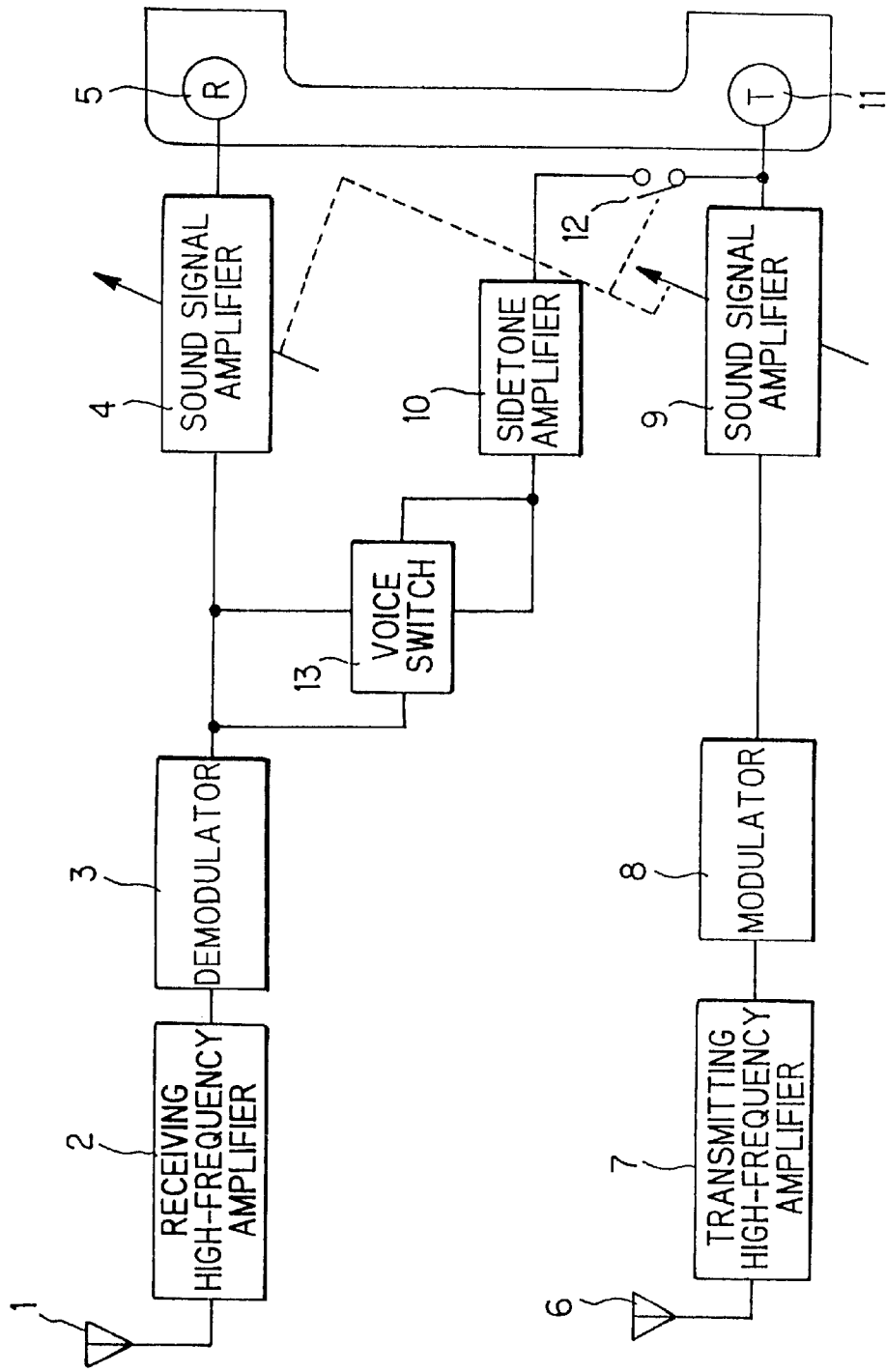
FIG. 1 is a block diagram of a conventional portable telephone set.

In FIG. 1, an electric signal transmitted from a base station (not shown) is received by a receiving antenna 1. The signal is processed through a receiving high-frequency amplifier 2, a demodulator 3 and a sound signal amplifier 4, and converted into a sound by an earphone 5. On the other hand, a sound collected by a microphone 11 is converted into an electric signal by it. The signal is processed through another sound signal amplifier 9, a modulator 8 and a transmitting high-frequency amplifier 7, and transmitted from a transmitting antenna 6 to the base station.

This telephone set also includes a manual switch 12 for setting a public environment mode when the user uses it in a public environment. The switch 12 is interlocked with the sound signal amplifiers 4 and 9. When the switch 12 is turned on, the amplification degree of each of these amplifiers 4 and 9 is increased by a certain amount. At the same time, when the switch 12 is turned on, a sidetone amplifier 10 operates to amplify the signal from the microphone 11. The signal output from this amplifier 10 is amplified further by the sound signal amplifier 4 and input to the earphone 5 so that the user's sidetone can be heard loudly. More specifically, the output from the sidetone amplifier 10 is input through a voice switch 13 to the sound signal amplifier 4. While the user is not speaking or the other party is speaking, the voice switch 13 operates to interrupt the signal from the sidetone amplifier 10 to the sound signal amplifier 4, preventing the other party's voice from deteriorating or worsening.

Figure 2:
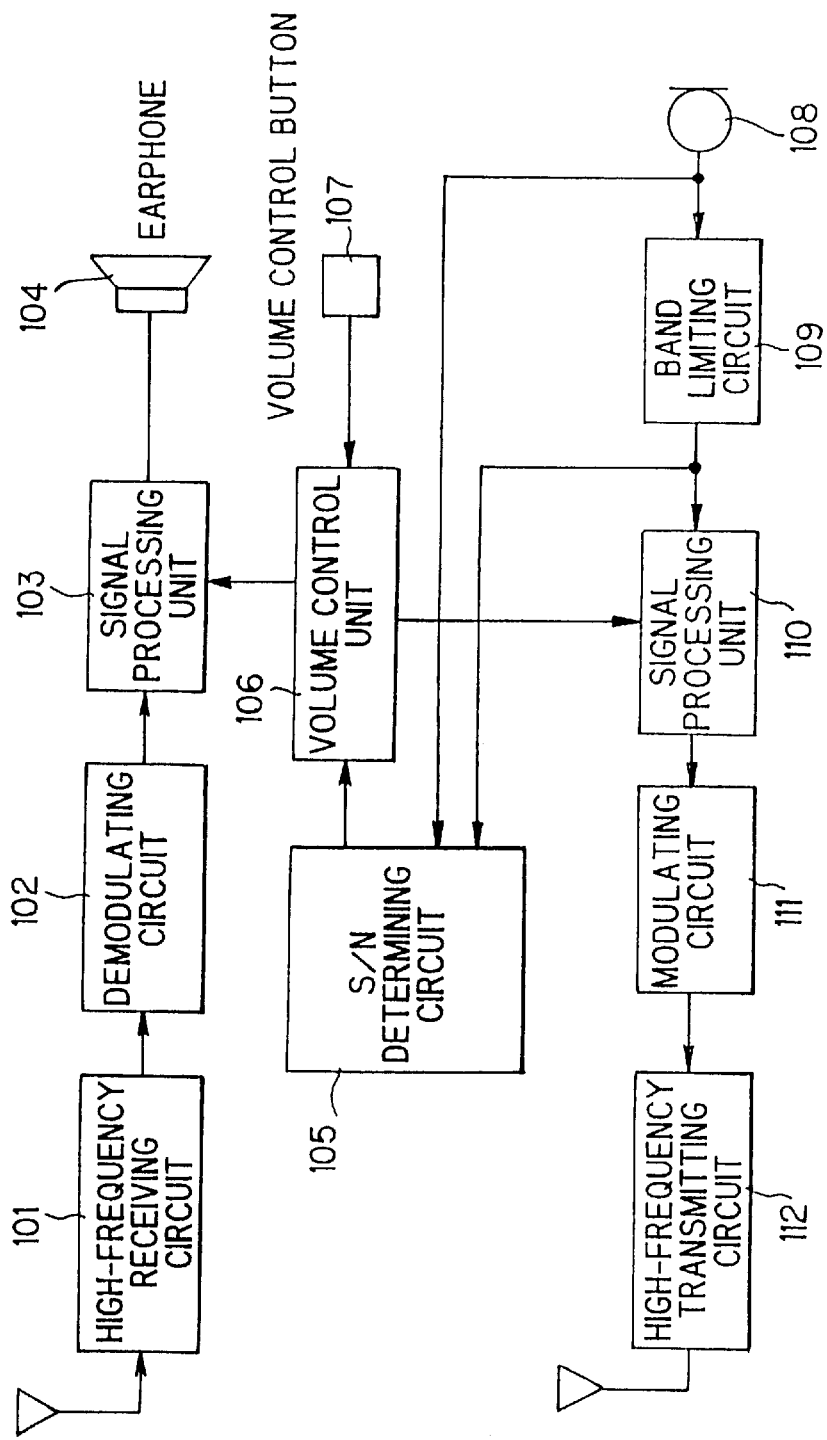
FIG. 2 is a block diagram of a portable telephone set according to a preferred embodiment of the invention.

Next, a portable telephone set in the preferred embodiment according to the invention will be explained in FIG. 2. The portable telephone set includes a receiving system and a transmitting system.

The receiving system includes a high-frequency receiving circuit 101 for receiving a radio signal transmitted from a base station. This system also includes a demodulating circuit 102 for demodulating a signal output from the receiving circuit 101. This system further includes a signal processing unit 103 for amplifying a signal output from the demodulating circuit 102. A signal output from the processing unit 103 is converted into a sound by an earphone 104.

The transmitting system includes a band limiting circuit 109 for extracting the human voice band from the signal output from a microphone 108. The microphone 108 collects the user's voice, the ambient or environmental noise, etc. and converts the collected sound into an electric signal. This system also includes a signal processing unit 110 for amplifying a signal output from the limiting circuit 109. This system further includes a modulating circuit 111 for modulating a signal output from the processing unit 110, and a high-frequency transmitting circuit 112 for transmitting as a radio signal to the base station a signal output from the modulating circuit 111.

The amplification degrees of the signal processing units 103 and 110 are controlled by a volume control unit 106, which can be turned on and off by pushing a volume control button 107. An S/N determining circuit 105 compares the levels of the signal from the microphone 108 and the signal from the band limiting circuit 109. On the basis of the result of the comparison, the determining circuit 105 controls the operation of the volume control unit 106.

The operation of this telephone set will be explained with reference to FIGS. 2 and 3.

If the user pushes the volume control button 107 (S101), the volume control unit 106 increases the amplification degree of the signal processing unit 110 by a certain amount. This makes it easy for the other party to hear even if the user does not speak loudly (S102). At the same time, the control unit 106 also increases the amplification degree of the other processing unit 103 by a certain amount. This enables the user to recognize that the user's voice can be transmitted to the other party even if the user does not speak loud (S102). The S/N determining circuit 105 monitors the ratio of the level of the signal from the microphone 108 to the level of the signal from the band limiting circuit 109 (S103). At step S103, if the determining circuit 105 judges that the ambient noise has increased and the ratio has exceeded a predetermined range, this circuit 105 controls the volume control unit 106 to cancel the volume increasing function of this control unit (S104). This decreases the amplification degree of the signal processing unit 103, thereby inhibiting the user from speaking excessively low. At the same time, the amplification degree of the processing unit 110 decreases, the other party is prevented from hearing the noise around the user.

Even after the volume increasing function is canceled, the S/N determining circuit 105 keeps monitoring the ratio of the level of the signal from the microphone 108 to the level of the signal from the band limiting circuit 109 (S105). If the determining circuit 105 judges that the ambient noise has decreased and the ratio has fallen within a predetermined range, this circuit 105 controls the volume control circuit 106 to restore the volume increasing function (S016). It is preferable that this range set for restoring the volume increasing function be narrower than the range set for canceling this function, in order to prevent the function from turning on and off frequently.

The user can push the volume control button 107 every time the user considers that it is necessary to do so, as is the case with the prior art disclosed in Japanese Patent Laid-Open No. H.6-6441. Instead, the telephone set may be modified in such a manner that the button 107 is turned on always in the standard mode. In this case, normally, even if the user does not speak loudly, it is easy for the other party to hear. When the ambient noise is so loud that the other party may hear the noise loudly, that the user's voice may deteriorate or that other inconvenience may be caused if the volume increasing function is on, this function is canceled automatically. Thereafter, when the noise lowers, the volume increasing function is restored automatically. Therefore, the user does not need to operate and care for anything for increasing the volume of sound.

As stated above, if the ambient noise if loud relatively to the user's voice, the amplification degree of the signal processing unit 103 decreases automatically, even while the volume increasing function is on. This inhibits the user from speaking excessively low. At the same time, the amplification degree of the other processing unit 110 decreases. This prevents the other party from loudly hearing the noise around the user. If the ambient noise decreases, the volume increasing function is restored automatically. This maintains the talking or aural quality of the telephone set, and improves its operability.

Although the invention has been described with respect to specific embodiment for complete and clear disclosure, the appended claims are not to be thus limited but are to be construed as embodying all modification and alternative constructions that may be occurred to one skilled in the art which fairly fall within the basic teaching here is set forth.

What is claimed is:

1. A portable telephone set comprising:
   a demodulating circuit for demodulating a signal from a base station to output a demodulated signal;
   a first signal processing unit for amplifying the demodulated signal to output a first amplified signal;
   an earphone for converting the first amplified signal into a sound;
   a microphone for converting a sound into an electric signal;

a second signal processing unit for amplifying the electric signal from said microphone to output a second amplified signal;

a modulating circuit for modulating the second amplified signal to output a modulated signal;

a volume control unit for increasing the amplification degrees of said first and second signal processing units in accordance with the user's selection;

a band limiting circuit for limiting to the voice band the sound input through the microphone; and an S/N determining circuit for comparing the level of the signal from said microphone and the level of a signal from said band limiting circuit;

said volume control unit being rendered inoperative if said S/N determining circuit judges that the ratio of the level of the electric signal from said microphone to the level of the signal from said band limiting circuit has exceeded a predetermined range during the operation of said volume control unit.

2. The portable telephone as defined in claim 1, wherein:

said volume control unit is rendered operative if said S/N determining circuit judges that the ratio of the level of the signal from said microphone to the level of the electric signal from said band limiting circuit has decreased to a predetermined range while said volume control unit is inoperative.

3. A portable telephone set comprising:

a transmitting circuit for transmitting a signal which is based on sound-electric signal conversion of a user's voice, and modulation of an electric signal obtained in said sound-electric conversion;

a receiving circuit for receiving a signal to be demodulated and converted to sound;

a signal to noise ratio-measuring circuit for measuring a ratio of said electric signal to a noise around a user; and a controller for increasing amplification degrees of said transmitting and receiving circuits, when said ratio is in a predetermined range, wherein said controller adjusts said predetermined range to be widened, once said transmitting and receiving circuits are controlled to be increased in said amplification degrees.

4. The portable telephone set as defined in claim 3, wherein:

said controller is instructed to control said transmitting and receiving circuits by turning a manual switch on.

5. A portable telephone set comprising:

a transmitting circuit for transmitting a signal which is based on sound-electric signal conversion of a user's voice, and modulation of an electric signal obtained in said sound-electric conversion;

a receiving circuit for receiving a signal to be demodulated and converted to sound;

a signal to noise ratio-measuring circuit for measuring a ratio of said electric signal to a noise around a user;

a controller for increasing amplification degrees of said transmitting and receiving circuits, when said ratio is in a predetermined range, wherein said controller adjusts said predetermined range to be narrowed, once said transmitting and receiving circuits are released from control of said controller.

6. The portable telephone set as defined in claim 5, wherein:

said controller is instructed to control said transmitting and receiving circuits by turning a manual switch on.

* * * * *